United States Patent [19]

Leuthen

[11] Patent Number: 4,680,664
[45] Date of Patent: Jul. 14, 1987

[54] OVERCURRENT PROTECTION CIRCUIT FOR POWER TRANSISTORS

[75] Inventor: John M. Leuthen, Claremore, Okla.

[73] Assignee: Hughes Tool Company, Houston, Tex.

[21] Appl. No.: 806,873

[22] Filed: Dec. 9, 1985

[51] Int. Cl.[4] ............................................. H02H 3/04
[52] U.S. Cl. ...................................... 361/91; 361/101; 363/56
[58] Field of Search .................. 361/88, 89, 91, 93, 361/94, 98, 101, 18; 323/289; 363/56

[56] References Cited

U.S. PATENT DOCUMENTS

| 4,158,866 | 6/1979 | Baker | 361/88 X |
| 4,375,074 | 2/1983 | Glogolja | 361/91 |
| 4,467,258 | 8/1984 | Leuthen | 318/800 |
| 4,491,892 | 1/1985 | Lehmann et al. | 361/91 X |
| 4,504,899 | 3/1985 | Jessee | 363/56 |
| 4,589,051 | 5/1986 | Santurtûn | 361/88 |

OTHER PUBLICATIONS

The Power Transistor in its Environment, p. 120.

Primary Examiner—A. D. Pellinen
Assistant Examiner—H. L. Williams
Attorney, Agent, or Firm—James E. Bradley

[57] ABSTRACT

A protection circuit for a power transistor cuts off the transistor if an overcurrent condition occurs. The protection circuit includes control transistors that are switched on and off to alternately supply positive voltage to the base of the power transistor to turn it on and negative voltage to turn it off. A control circuit provides signals to the control transistors to turn them on and off. A latch has an input connected across the collector and emitter of the power transistor for monitoring the voltage. If the voltage exceeds a threshold level at the latch, the latch will provide a disabling output to the control circuit to turn off the power transistor.

3 Claims, 2 Drawing Figures

4,680,664

OVERCURRENT PROTECTION CIRCUIT FOR POWER TRANSISTORS

BACKGROUND OF THE INVENTION

1. Field of the Invention

This invention relates in general to electronic circuitry to protect excessive currents flowing through a power transistor, and in particular to a circuit that monitors the voltage across the transistor to determine excessive current.

2. Description of the Prior Art

Large capacity power transistors are used in variable speed drive systems for large alternating current (AC) motors. In a variable speed drive system of this type, three phase AC power is rectified into positive and negative DC rails. The three power lines for the three phase AC motor are connected to these rails through power transistors. When a power transistor is on, it will supply voltage from one of the rails to the motor. Control circuitry is used to control the frequency and sequence of the operation of the power transistors.

Power transistors are normally operated in a saturated condition. That is, increasing the current to the base beyond the saturated point will not result in any more increase in current through the collector. If the collector current becomes excessive relative to the base current, this indicates that the transistor is coming out of saturation. Normally this happens only if a malfunction is occurring. Perhaps more than one of the transistors are erroneously conducting at the same time.

SUMMARY OF THE INVENTION

A protection circuit is provided for the power transistors to prevent excessive collector current. The protection circuit has a latch which monitors the voltage across the collector and emitter. If the voltage exceeds a threshold level for triggering the latch, a disabling output is provided by the latch. Voltage across the collector and emitter above the threshold level indicates that the transistor is coming out of saturation.

The disabling output leads to the control transistors which are connected to the base of each power transistor for providing positive base current to turn the transistor on and negative current to turn the transistor off. The disabling signal of the latch causes the control transistors to provide negative current to the base of the power transistor to cut it off. A clamp holds the input of the latch to a low value below the threshold level while the power transistor is in its normal off condition.

DESCRIPTION OF THE PREFERRED EMBODIMENT

Figure 1:
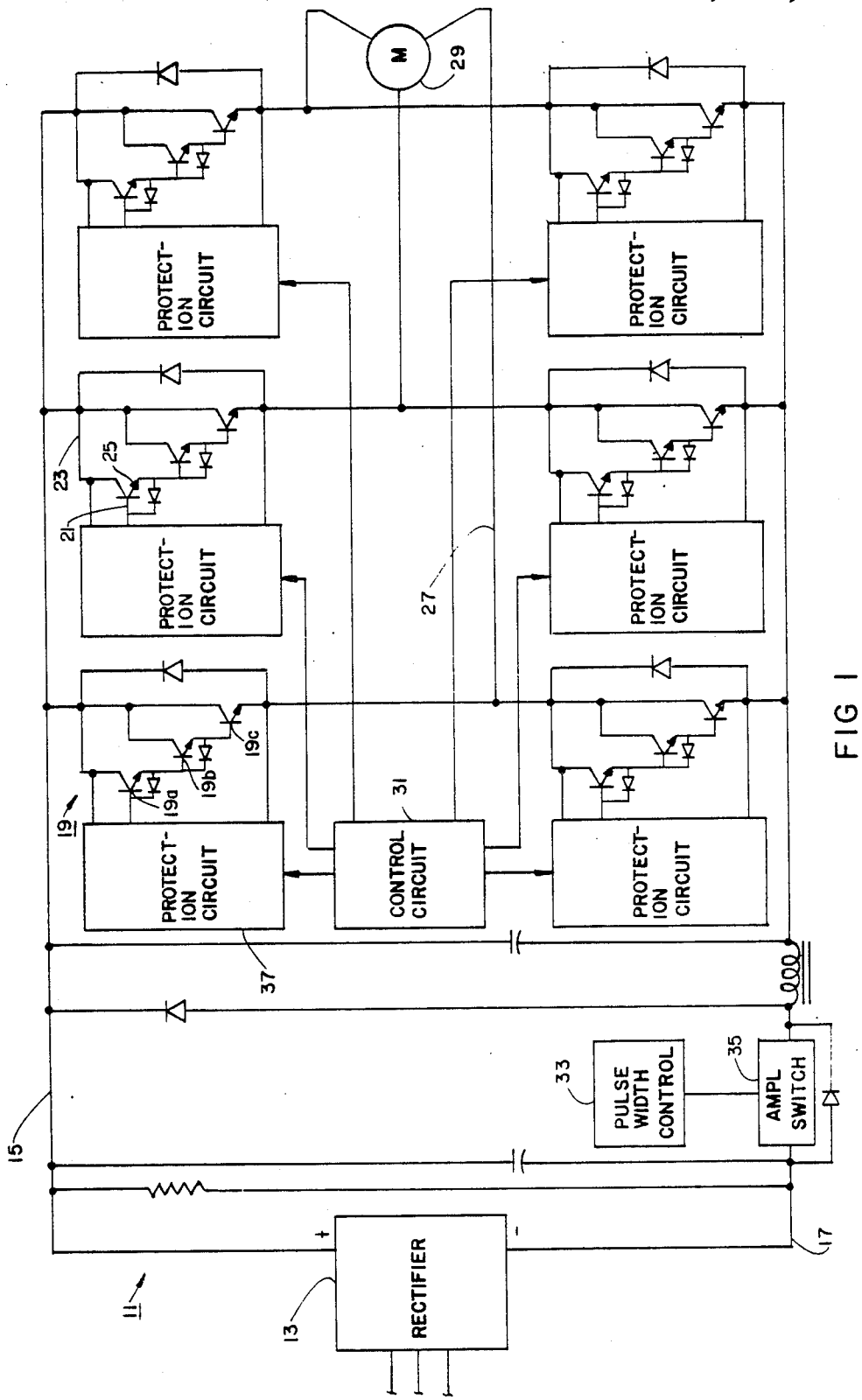
FIG. 1 is a schematic block diagram view of a variable speed drive system for an AC motor, showing protection circuits as constructed in this invention.

Referring to FIG. 1, the variable frequency drive system 11 has a rectifier 13 which receives three phase AC power and converts it to positive and negative DC power on DC rails 15 and 17. There are six power transistors 19. In the preferred embodiment, each power transistor 19 is connected in Darlington form, with three transistors 19a, 19b and 19c connected together. Each of the transistors 19 has a base 21, collector 23 and emitter 25. The emitter of transistor 19a is connected to the base of transistor 19b. The emitter of transistor 19b is connected to the base of the transistor 19c. Three of the power transistors 19 have their collectors connected to the positive rail 15. The other three transistors 19 each have the transistor 19c connected with its emitter connected to the negative rail 17.

There are three lines 27 for the three phase motor 29. Each line 27 is connected to one pair of the transistors 19 for alternately receiving positive and negative voltage. A control circuit 31 controls the rate at which the transistors 19 turn on and off, as well as the sequence. The amplitude may be controlled by a pulse width control circuit 33, which actuates an amplitude switch 35 to vary the DC potential between the rails 15 and 17. A protection circuit 37 is connected between the control circuit 31 and the power transistors 19 for each of the power transistors 19.

Figure 2:
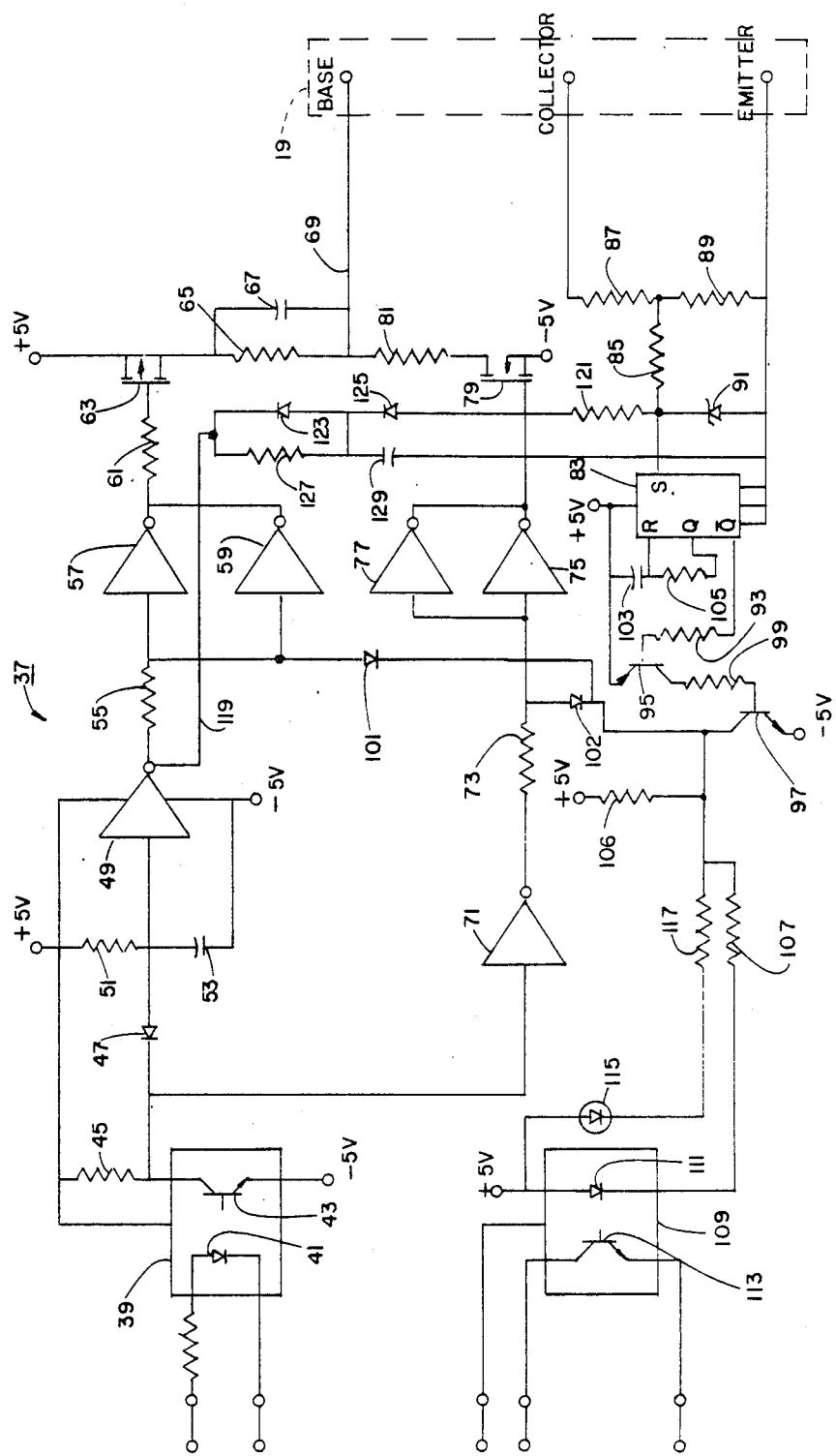
FIG. 2 is an electrical schematic showing the components of one of the protection circuits of FIG. 1.

The protection circuit 37 is shown in detail on FIG. 2. Protection circuit 37 monitors the voltage across the collector and emitter of the power transistor 19, and turns the power transistor 19 off if excessive voltage is encountered while the power transistor is on. The protection circuit 37 includes an optocoupler 39 which has input leads connected to the control circuit 31 (FIG. 1) for receiving pulses to turn on and off the power transistor 19. The optocoupler 39 is a conventional element, having a light emitting diode 41 which is on the input side. LED 41 controls a photo transistor 43, which has its emitter connected to a negative 5 volt source. The collector is connected through a resistor 45 to a positive 5 volt source. The collector is also connected through a diode 47 to an inverter 49. Diode 47 is connected so that it will pass negative voltage to the inverter 49. The inverter 49 is powered by the 5 volt source, and its input is also connected through a resistor 51 to the positive 5 volt source. A capacitor 53 is connected between the input of inverter 49 and a negative 5 volt source.

The protection circuit 37 is designed such that when the input to inverter 49 is low, it will turn on the power transistor 19. The low at the input of inverter 49 is inverted to a high, which passes through a resistor 55 to a second inverter 57. Inverter 57 is in parallel with another inverter 59, which operates simultaneously with inverter 57, and will not be further mentioned. Inverter 57 inverts the high at its input to a low, which passes through a resistor 61 to a control transistor 63.

Control transistor 63 is preferably a P channel field effect transistor (FET). Control transistor 63 has its source connected to a positive 5 volt supply, its gate connected to the resistor 61, and its drain connected to a resistor 65. Resistor 65 has a capacitor 67 in parallel, and each is connected to a line 69 which leads to the base of the power transistor 19. When inverter 49 has a low input, inverter 57 will have a low output, which turns on the control transistor 63, providing a positive voltage, and thus a base current to the power transistor 19 (FIG. 1).

The protection circuit 37 also includes an inverter 71 which is connected between the collector of the photo transistor 43 and the diode 47. While power transistor 19 (FIG. 1) is on, inverter 71 will have a low at its input, and a high on its output which passes through a resistor 63 to a second inverter 75. Inverter 75 also has an inverter 77 in parallel, which will not be further mentioned. Inverter 75 inverts the high at its input to a low, which leads to a second control transistor 79. Control transistor 79 is also a field effect transistor, however, it is of a N channel type. It has its source connected to a negative 5 volt supply, its gate connected to the output of the inverter 75, and its drain connected through a resistor 81 to the line 69. Control transistor 79 requires a high to conduct. While transistor 63 is conducting, with a low at its gate, transistor 79 will be off, since it also has a low at its gate.

When the power transistor 19 is to be turned off, the photo transistor 43 is cut off by a signal at the optocoupler 39. This causes a high at the input of inverter 71, providing a low output. Inverter 75 will then provide a high output, which turns on the control transistor 79. The negative 5 volts then will be connected with the line 69 and the base of the power transistor 19 to cut the power transistor 19 off. There is also a high at the input of inverter 49 when a high exists at the input of inverter 71. This results in a high output from inverter 49, which turns control transistor 63 off. The protection circuit 37 thus has control means for turning one of the transistors 63, 79 off while the other is on to alternately supply positive and negative voltage to the base of the power transistor 19.

A latch means 83 is used to monitor the voltage across the collector and emitter of the power transistor 19, and to provide a disabling output to turn transistor 19 off if the voltage exceeds a threshold level while the transistor 19 is on. Latch 83 is a conventional bistable multivibrator, preferably a CD 4013 CMOS data latch. Latch 83 has a set input labeled S which is connected through a resistor 85 to voltage dividing resistors 87, 89. Resistor 87 is a one Meg ohm resistor connected to the collector of power transistor 19. Resistor 89 is preferably 470K ohms, and it is connected to the emitter of power transistor 19. Latch 83 is also connected to the emitter for sensing a potential difference at the set input. The emitter of power transistor 19 is considered common for this circuit.

A zener diode 91 is connected between the emitter and the set input. Normally, during conduction of the power transistor 19, there will be only about 2.5 volts potential difference between the collector and emitter. The threshold level to trigger latch 83 is only slightly above 2.5 volts.

If the threshold level is exceeded, the set input of latch 83 will change the Q-not output to a low, it normally being high. This low turns on a disabling transistor 95, which is of a PNP type and connected through a resistor 93 to the Q-not output. Transistor 95 has its collector connected through a resistor 99 to the base of another disabling transistor 97. When transistor 95 turns on, it will turn on the disabling transistor 97, which places a low at the input of inverters 57 and 75. The low at these points turns off the control transistor 63 and turns on the control transistor 79, to provide negative base current, turning off the power transistor 19. Diodes 101 and 102 are connected between the collector of the transistor 97 and the inputs to the inverters 57 and 75 to allow the low condition to occur. Diodes 101 and 102 block any high outputs of inverters 49 and 71 from the collector of disabling transistor 97.

At the same time that the Q-not output goes low, the Q output will go high. The Q output is connected through a resistor 105 and a capacitor 103 to the 5 volt supply for the latch 83. This results in capacitor 103 discharging, which will be sensed by the reset input of latch 83, to reset the latch 83.

A warning when the latch 83 trips is provided for informing the operator of such occurrence. The collector of the disabling transistor 97 is connected to a 5 volt source through a resistor 106. A resistor 107 connects the collector to an optocoupler 109. Optocoupler 109 has a conventional LED 111 and photo transistor 113. When the collector of transistor 97 goes low, conduction of the LED 111 will occur, providing a signal. Also, a warning lamp 115 will light up, it being connected through a resistor 117 to the collector of the disabling transistor 97.

While the power transistor 19 is turned off, high voltage will be present between the collector and emitter. The zener diode 91 will prevent the voltage at the set input of latch 83 from exceeding about 10 volts at any time, but this is well above the threshold level necessary to trip latch 83 to cause a disabling output. The latch 83 must be prevented from tripping to disable the operation of the power transistor 19 while the power transistor 19 is in its normally off condition. A clamping means prevents this occurrence. The clamping means includes a clamping line 119 that extends from the output of the inverter 49 through a resistor 121 to the set input of the latch 83. While the power transistor 19 is off, the output of the inverter 49 will be low. The low output applied to the set input of latch 83 maintains the value below the threshold level and prevents the triggering. Diodes 123 and 125 are connected so as to allow the low to pass to the set input of latch 83, but to prevent any high at the output of inverter 49 from influencing the latch 83.

There is also a delay means to prevent the latch 83 from tripping at the moment that the power transistor 19 is being turned on. Power transistor 19 will likely be turned on about 60 cycles per second, and there is a possibility that there could be sufficient voltage between the collector and emitter at the instant the transmitter 19 is turned on to cause tripping by the latch 83 erroneously. This delay means includes a resistor 127 and a capacitor 129. Resistor 127 is connected in parallel with diode 123 in the clamping line 119. The capacitor 129 is connected in series with resistor 127 and to the emitter of transistor 19. When the inverter 49 goes high, capacitor 129 will charge through the resistor 127. This requires the set input 83 to stay low for about a preferred two microsecond delay while the charging of capacitor 129 takes place.

After capacitor 129 is fully charged, then the clamping line 119 will have no effect on the set input of latch 83, since a high on this line will be blocked by the diodes 123 and 125. The diodes 123 and 125 also serve as bypass means to prevent the capacitor 129 from having any effect when the power transistor 19 is being turned off. When being turned off, the output of the inverter 49 will be switched to a low. This low immediately passes through the diodes 123 and 125 to hold the input to the latch 83 low, bypassing any time delay through the resistor 127 and capacitor 129.

During normal operation, the control transistors 63 and 79 will be alternately switched on and off, with one of them always on while the other is off. To provide positive current on the base of the power transistor 19, the optocoupler 39 will be energized, which results in a low output on the inverter 57, turning on the control transistor 63. The low output from the optocoupler 39 results in a high output on inverter 75, turning off the control transistor 79. When optocoupler 39 is turned off, the reverse occurs, with control transistor 79 conducting to provide negative current to turn off the power transistor 19.

If the voltage across the collector and emitter exceeds a threshold level while the power transistor 19 is conducting, the latch 83 will provide an output to turn on the disabling transistors 95 and 97. This results in a low being applied to inverters 57 and 75. This turns on control transistor 79, and turns off control transistor 63, to turn off the power transistor 19 and to prevent damage.

The invention has significant advantages. By monitoring the voltage across the collector emitter, the power transistor can be protected against an overcurrent condition. The circuitry also avoids false tripping which might occur at the moment the transistor is turned on. The circuitry allows a warning to be provided for further investigation .

While the invention has been shown on only one of its forms, it should be apparent that those skilled in the art that is not so limited, but is susceptible to various changes without departing from the scope of the invention.

I claim:

1. A protection circuit for a power transistor of the type having its collector and emitter connected to positive and negative DC rail lines, and having a base that when supplied with positive current, causes the power transistor to conduct, and when supplied with negative current, causes the power transistor to cut off, the circuit comprising in combination:
    positive and negative control transistors, one having an input connected to a positive voltage source, and the other having an input connected to a negative voltage source, each control transistor having an output being connected to the base of the power transistor for providing positive current while the positive control transistor is on, and negative current while the negative control transistor is on;
    control means for supplying energizing signals to the control transistors to turn on the positive control transistor and off the negative control transistor, and deenergizing signals to the control transistors to turn off the positive control transistor and on the negative control transistor;
    latch means comprising a bistable multivibrator having an input connected to the power transistor for monitoring the voltage across the collector and emitter, and if the voltage exceeds a selected level while the power transistor is on, providing a disabling output;
    disabling means connected to the multivibrator and to the control means for turning off the positive control transistor and for turning on the negative control transistor when the disabling means receives a disabling output from the multivibrator; and
    clamp means for holding the input of the multivibrator to a low value below the threshold level while the control means is supplying a deenergizing signal to the control transistors, to prevent triggering of the multivibrator while the power transistor is off, the clamp means including a clamp line extending from the control means to the input of the multivibrator, and including blocking means in the clamp line for blocking the energizing signals from the input of the multivibrator to hold the input of the multivibrator to the low value.

2. A protection circuit for a power transistor of the type having its collector and emitter connected to positive and negative DC rail lines, and having a base that when supplied with positive current, causes the power transistor to conduct, and when supplied with negative current, causes the power transistor to cut off, the circuit comprising in combination:
    positive and negative control transistors, one having an input connected to a positive voltage source, and the other having an input connected to a negative voltage source, each control transistor having an output being connected to the base of the power transistor for providing positive current while the positive control transistor is on, and negative current while the negative control transistor is on;
    control means for supplying energizing signals to the control transistors to turn on the positive control transistor and off the negative control transistor, and deenergizing signals to the control transistors to turn off the positive control transistor and on the negative control transistor;
    latch means comprising a bistable multivibrator having an input connected to the power transistor for monitoring the voltage across the collector and emitter, and if the voltage exceeds a selected level while the power transistor is on, providing a disabling output;
    disabling transistor means including a disabling transistor connected to the control means and having a base connected to the output of the multivibrator, for preventing the control means from supplying energizing signals to the control transistors while the base of the disabling transistor is receiving a disabling output from the multivibrator; and
    clamp means for holding the input of the multivibrator to a low value below the threshold level while the control means is supplying a deenergizing signal to the control transistors, to prevent triggering of the multivibrator while the power transistor is off, the clamp means including a clamp line extending from the control means to the input of the multivibrator, and including blocking means in the clamp line for blocking the energizing signals from the input of the multivibrator to hold the input of the multivibrator to the low value.

3. A protection circuit for a power transistor of the type having its collector and emitter connected to positive and negative DC rail lines, and having a base that when supplied with positive current, causes the power transistor to conduct, and when supplied with negative current, causes the power transistor to cut off, the circuit comprising in combination:
    positive and negative control transistors, one having an input connected to a positive voltage source, and the other having an input connected to a negative voltage source, each control transistor having an output connected to the other, and the junction of the output being connected to the base of the power transistor for receiving positive current while the positive control transistor is on and negative current while the negative control transistor is on;
    control means for supplying energizing signals to the control transistors to turn on the positive control transistor and off the negative control transistor, and deenergizing signals to the control transistors to turn off the positive control transistor and on the negative control transistor;
    latch means comprising a bistable multivibrator having an input connected to the power transistor for mnitoring the voltage across the collector and emitter, and if the voltage exceeds a selected level while the power transistor is off, providing a disabling output, the latch means further having a reset means for removing the disabling output after a selected time delay;

disabling transistor means including a disabling transistor connected to the control means and having a base connected to the output of the multivibrator, for preventing the control means from supplying energizing signals to the control transistors while the base of the disabling transistor is receiving a disabling output from the multivibrator;

clamp means for holding the input of the multivibrator to a low value below the threshold level while the control means is supplying a deenergizing signal to the control transistors, to prevent triggering of the multivibrator while the power transistor is off, the clamp means including a clamp line extending from the control means to the input of the multivibrator, and including blocking means in the clamp line for blocking the energizing signals from the input of the multivibrator and allowing the deenergizing signals to pass to the multivibrator to hold the input of the multivibrator to the low value;

delay means connected to the clamp line for delaying the removal of the denergizing signal from the multivibrator input for a brief duration after an energizing signal is provided by the control means to the control transistors; and the blocking means also serving as bypass means for causing the deenergizing signals to bypass the delay means.

* * * * *